US011512990B2

(12) United States Patent
Huang et al.

(10) Patent No.: US 11,512,990 B2
(45) Date of Patent: Nov. 29, 2022

(54) GAS METER WITH THERMAL TIME-OF-FLIGHT SENSING

(71) Applicants: Liji Huang, Santa Clara, CA (US); Chih-Chang Chen, Cupertino, CA (US)

(72) Inventors: Liji Huang, Santa Clara, CA (US); Chih-Chang Chen, Cupertino, CA (US)

(73) Assignee: Wisenstech Ltd., Santa Clara, CA (US)

( * ) Notice: Subject to any disclaimer, the term of this patent is extended or adjusted under 35 U.S.C. 154(b) by 302 days.

(21) Appl. No.: 16/918,237

(22) Filed: Jul. 1, 2020

(65) Prior Publication Data
US 2022/0003584 A1 Jan. 6, 2022

(51) Int. Cl.
G01F 1/68 (2006.01)
G01F 1/684 (2006.01)
G01F 15/00 (2006.01)
B81B 7/02 (2006.01)
G01F 15/063 (2022.01)
G06Q 50/06 (2012.01)
G01F 15/04 (2006.01)

(52) U.S. Cl.
CPC ............ G01F 1/6845 (2013.01); B81B 7/02 (2013.01); G01F 15/002 (2013.01); G01F 15/043 (2013.01); G01F 15/063 (2013.01); G06Q 50/06 (2013.01); B81B 2201/0264 (2013.01); B81B 2201/0278 (2013.01)

(58) Field of Classification Search
CPC .... G01F 1/6845; G01F 15/002; G01F 15/043; G01F 15/063; G01F 1/6842; G01F 1/6888; G01F 1/6986; G01F 15/046; G01F 15/02; B81B 7/02; B81B 2201/0264; B81B 2201/0278; G06Q 50/06
See application file for complete search history.

(56) References Cited

U.S. PATENT DOCUMENTS

| 8,794,082 | B2 * | 8/2014 | Huang | G01F 1/72 |
| | | | | 73/204.26 |
| 2009/0049907 | A1 * | 2/2009 | Wu | G01F 1/6845 |
| | | | | 73/204.26 |
| 2012/0216629 | A1 * | 8/2012 | Huang | G01F 1/72 |
| | | | | 73/861.95 |
| 2014/0116129 | A1 * | 5/2014 | Yang | G01F 1/6842 |
| | | | | 73/204.22 |
| 2014/0118161 | A1 * | 5/2014 | Jiang | H04Q 9/00 |
| | | | | 73/202 |
| 2017/0241822 | A1 * | 8/2017 | Wong | G01D 4/02 |
| 2018/0164137 | A1 * | 6/2018 | Layher | E21B 47/06 |
| 2021/0396548 | A1 * | 12/2021 | Huang | G01F 1/6965 |

* cited by examiner

Primary Examiner — Francis C Gray

(57) ABSTRACT

An electronic utility gas meter using MEMS thermal time-of-flight flow sensor to meter gas custody transfer mass flowrate and an additional MEMS gas sensor to measure the combustion gas composition for the correlations to the acquisition of gas high heat value simultaneously is disclosed in the present invention. The meter is designed for the applications in the city utility gas consumption in compliance with the current tariff while metering the true thermal value of the delivered gases for future upgrades. Data safety, remote data communication, and other features with state-of-the-art electronics are also included in the design.

15 Claims, 5 Drawing Sheets

GAS METER WITH THERMAL TIME-OF-FLIGHT SENSING

BACKGROUND OF THE INVENTION

1. Field of the Invention

Figure 1:
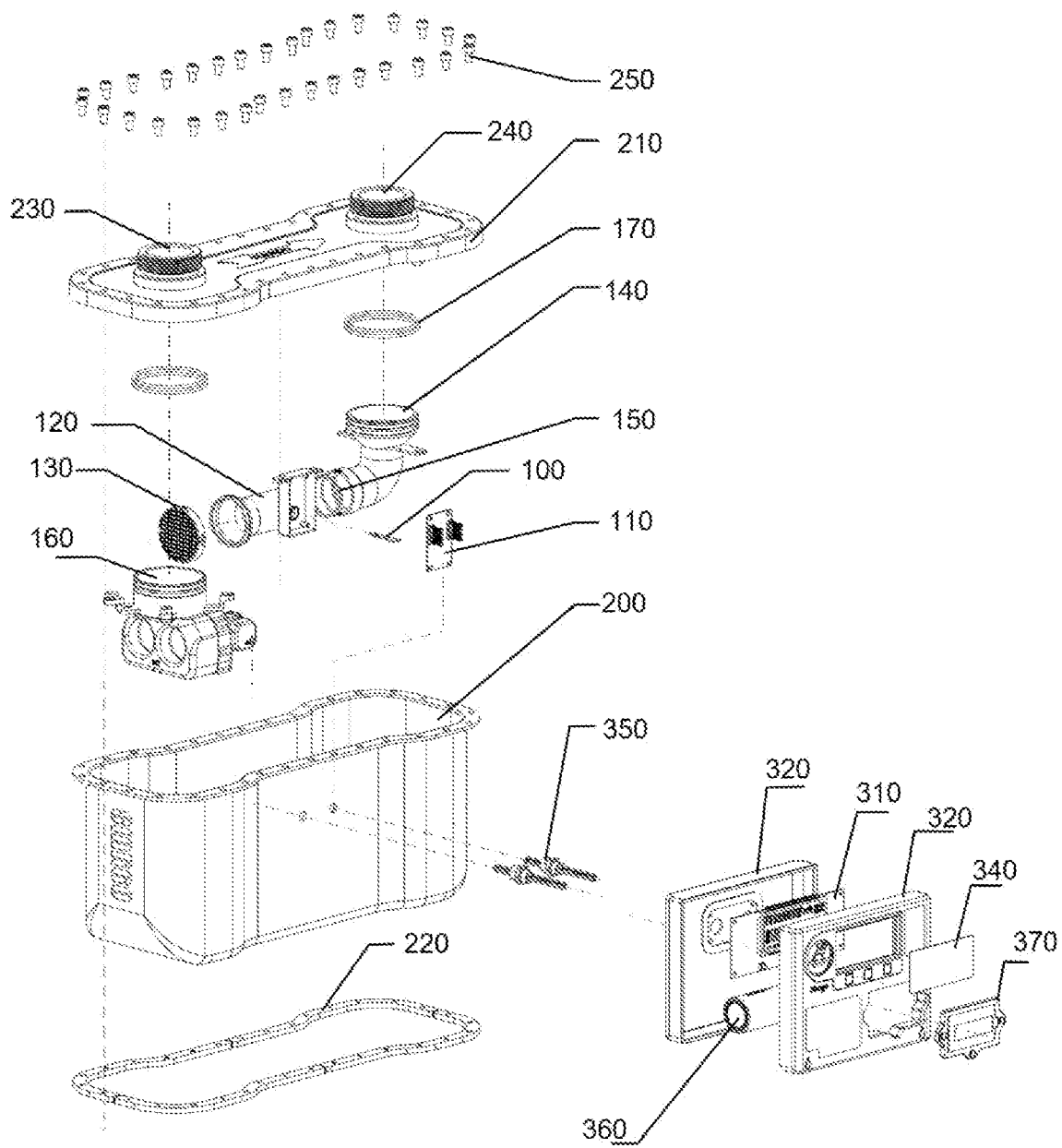

This invention relates to an apparatus for the measurement of natural gases in city gas metering. Specifically, this invention relates to a utility gas metering using micromachined flow sensing technology to meter the city gas in the utility industry requiring custody transfer or tariff. This invention also provides the design and make of a gas meter with gas thermal values with remote data capability and other intelligent functions, which can be used in the utility gas industry.

2. Description of the Related Art

The promotion of clean energy usage for residential applications has been one of the key tasks for governments around the world to fight for global climate changes. Natural gas as clean energy has been channeled to more and more countries for residential appliances. Distribution of natural gas however is based on the volumetric value for the current tariff regulations in almost all countries. The current metering technologies are also mechanical in the measurement principle which varies due to temperature and pressure change. In addition, for consumers, the actual consumption of natural gas is the heating value of the gas, not the volume of the gas. The natural gas thermal values depend on the gas components and therefore it will be different for consumers even with the same volumetric meter but when the supplied gas source is changed. Also, for gas distributors, the gas they purchased is often measured with high precision meters as well as by the thermal values that are measured by complicated instrumentation such as gas chromatography or involving a complicated measurement at the off-line system level (e.g. E. L. Szonntagh, Method for operating a gas analyzing system and apparatus utilizing the same, U.S. Pat. No. 4,415,278, Nov. 15, 1983). Therefore, when the gas is redistributed to the consumers, the metering apparatus is a low precision and volumetric value. In some countries, the revenue losses are compensated with government subsidy while some gas distributors apply a gas conversion factor to volumetric values to maintain their profits. This factor is changing from time to time and determination of such a factor is by the gross distribution but not the actual metering that its base is always in questions.

In an earlier disclosure, A. Roger. L. et al teaches a MEMS sensor that can be used for measurement of thermal conductivity and specific heat of a gaseous fluid (A. Roger L., U. Bonne, and R. J. Matthys, Measurement of thermal conductivity and specific heat, U.S. Pat. No. 4,944,035, Jul. 24, 1990). The sensor is constituent of a microheater and temperature sensors, and a temperature pulse generated by the microheater will be disposed in and closely coupled to the fluid to be measured. By measurement of the time response of the temperature registered by the sensor elements at the static condition, both thermal conductivity and specific heat could be obtained. As the MEMS sensor is an individual component that is also capable of metering the mass flow of the fluid. A flow meter with such a MEMS sensor can, therefore, be potentially made with the capability of metering the thermal values by the acquisition of the above-described parameters. In another disclosure by Bonne (U. Bonne, Flowmeter fluid composition correction, U.S. Pat. No. 4,961,348, Oct. 9, 1990) utilizes the above approach to normalize the gas characteristics such that a universal or gas independent thermal mass flow could be attested with experimentally determined constants. The above inventions pointed out the possibility that the gas thermal properties can be measured with a single MEMS sensor chip which can be effectively packaged in the flow meters eliminating the mandatory offline gas analyzing with complicated apparatus. However, each of these disclosures requires the static conditions during the measurement which would not be feasible in an application with a continuous flow medium. Furthermore, the measured thermal conductivity and specific heat are not the same as the thermal values of natural gas. In a previous publication by the applicant, (Huang L., City natural gas metering, Chapter 9 of Nature Gas, published by Intech, October 2012), the measured gas thermal conductivity and specific heat can be converted to the HHV (high heat value) of natural gas in cases the major components of the natural gases all contributed to the combustion. However, when some non-combustive components such as nitrogen or carbon dioxide take the sizable proportion, such conversion may no longer be possible for the required tariff accuracy.

In another disclosure by Lambert (D. K. Lambert, Thermal diffusion fluid flow sensor, U.S. Pat. No. 4,713,970 Dec. 22, 1987) and a subsequent disclosure by Bonne et al. (U. Bonne et al., Time lag approach for measuring fluid velocity, U.S. Pat. No. 6,234,016 May 22, 2001), the time differences are measured between a microheater and sensors placed close-by at a micrometer scale. By comparing the thermal responses of the sensors and the time lag of the heat transfer from the microheater to the sensor, the inventors claimed the success of measurement of a gas independent flow speed measurement by canceling out the thermal properties of the gases to be measured. A similar concept with disclosure by Maginnis (T. O. Maginnis, et al., MEMS thermal flow sensor with compensation for fluid composition) also pointed that by measurement of the sensor's time response (constant), it is possible to obtain a gas composition independent flowrate measurement, but it also requires a measurement performed at the static condition.

Therewith, for the purpose of metering the delivered gas thermal values for tariff apparatus that can be deployed to residential applications, it is desired to have a meter that can measure the desired thermal values in situ without the service interruption, as well as the gas property independent mass flowrate with custody transfer accuracy, can also be acquired simultaneously, such that the true thermal value tariff can be established while the measured gas composition independent mass flow rate can be applied for the volumetric based tariff with improved accuracy and performance. Further, such an apparatus will be compact for easy installation with the capability of replacing the existing installation seamlessly while having advanced features such as wireless data.

SUMMARY OF THE INVENTION

It is the objective of this invention to overcome the incompleteness and disadvantages associated with the prior arts and have a new utility gas meter based on the MEMS sensing technologies for city gas metering applications that can meter the volumetric flow rate with compensated temperature and pressure variations as well as total heat value delivered to establish the desired tariff. This disclosed meter will further have the capability to measure natural gas concentration and compensate for the heat values contributed by combustion gas components. The disclosed utility gas meter will also have the functionality that can ensure the data safety, data process, and remote data transmission to the designated data center as well as the system protection class per the utility industry regulations.

In one preferred embodiment, the disclosed utility gas meter that is capable of metering the custody transfer volumetric flowrate with temperature and pressure compensation while performing in situ measurement of heat value of natural gases without the requirements of offline gas analysis and combustion measurement that can only be performed at some specific time and specific locations. The mass flowrate values equivalent to the temperature and pressure compensated volumetric flowrate will be independent of the gas composition and heat values and will provide the gas metering metrology that complies with the current tariff system. The simultaneously measured heat values can be used for database and references to establish the ultimate city natural gas metering tariff that is most fair and will be beneficial for both the city gas distributors and the end-users.

In another preferred embodiment, the disclosed utility gas meter that is capable of metering the custody transfer volumetric flowrate with temperature and pressure compensation while performing in situ measurement of the gas heat value. The gas meter will utilize the MEMS thermal time-of-flight sensor for metering the mass flowrate of the utility gas for the desired temperature and pressure independent tariff. To achieve the gas composition independent measurement, dual sensing elements are placed at the downstream of the microheater. The distances between the two sensing elements are set to be different from that to the one next to the microheater, such that to maximize the calibration. With the thermal time-of-flight sensing scheme, the sensing elements placed downstream to the microheater will sense two sets of signals when the flow medium carrying heat: the attenuated total heat and the transient time of the heat from microheater to the sensor. The convection of the total heat will be dependent on the mass flowrate, and the thermal properties of the flow medium, while the transient time of the heat convection will be dependent on the velocity of the flow medium and the flow medium thermal properties. The current technology of thermal flow sensing only has one sensing element at the downstream to the microheater, and only measures the total heat convection, therefore it would not possible to obtain the desired information for the mass flow as well as the heat value of the flow medium. With the simultaneously acquired four parameters of the total heat convection, heat convection transient time from the two sensing elements at the downstream to the microheater, the gas composition independent mass flow, and thermal properties of the flow medium can then be deduced from the measurement data. The data processing will not require the calibration of the sensing element and microheater in vacuum to register and differentiate the composite time response as the amplitude and transient time measurement will be different and one of each can be used at the calibration when the temperature and pressure are kept to be at the constant values. In this configuration and data acquisition, the gas thermal properties measurement will not be required to be measured only at the no-flow or static gas condition, and the pair of the sensing elements provide additional dimensions for the data process to eliminate the flow speed effects for gas property dependence.

In another preferred embodiment, the disclosed utility gas meter that is capable of metering the custody transfer volumetric flowrate with temperature and pressure compensation while performing in situ measurement of the gas heat value. The said thermal time-of-flight sensing scheme will measure the gas thermal properties include thermal conductivity and specific heat or thermal capacitance. For the interest of city utility gas applications, the thermal value or heat value is not the same as the gas thermal dynamic properties but they can be directly converted if the components of the utility gas will all contribute to the combustion. However, in many cases, the city utility gas will have a nontrivial portion of non-combustion gases such as nitrogen and carbon dioxide. These gases will not contribute to the high heat values of the utility gases but still will contribute to the measured total thermal conductivity and specific heat by the thermal time-of-flight sensing scheme. Therefore, a gas composition sensor will be needed to measure the concentration of the utility gases that will contribute to the actual high heat values. It is then preferred that such a gas composition sensor will also be made with MEMS sensing technology that allows the sensor to be operated in a low power mode and a miniaturized footprint. This gas composition sensor will be packaged together with the thermal time-of-flight sensor that both will be exposed to the flow gas medium but the gas composition sensor will be located at a position where the gas flow speed is null. The MEMS gas composition sensor is preferred with a low power metal-oxide sensing principle for its miniaturized footprint, but it can also be an infrared sensor using a microheater and thermopile combination. Other principles of optical and acoustic sensing can also be used but less preferred. For conservation of power, the MEMS gas composition sensor will not be operated in a constant time mode but can be set to wake up at a specific period or when the gas thermal properties measured by the thermal time-of-flight have deviated from the registered values. The measured gas composition data will then be sent to the control electronics of the meter for data processing for the true high heat values of the metering gases.

In another preferred embodiment, the disclosed utility gas meter that is capable of metering the custody transfer volumetric flowrate with temperature and pressure compensation while performing in situ measurement of the gas heat value including the dual-sensing elements having the thermal time-of-flight sensor for flow metrology and physical thermal properties and the gas sensor for gas composition, both of them are packaged in the proximity. The other constituents are the main flow channel with the flow conditioner; a flow partitioner, a buffer house; an ON/Off valve; the electronic control unit that has all the electronics providing the signal conditioning of the MEMS sensing elements, data acquisition from the MEMS sensing elements, data processing, data safety management, data interface for data transmission and the remote user communication as well as the power supply such as the lithium-ion battery. The electronics control unit will further relay the processed data to a local display, preferably made of a low power LCD, and manage the power usage of the system. Additional components include the local data communication port, mechanical connection, and gas sealing from leakage.

In another preferred embodiment, the disclosed utility gas meter that is capable of metering the custody transfer volumetric flowrate with temperature and pressure compensation while performing in situ measurement of the gas heat value will be preferred to have the MEMS sensing elements being packaged in the proximity where the thermal time-of-flight sensor is inserted into the flow partitioner while the gas sensing element is placed into the area where only static gas with exchange to the main flow channel that is made with a Venturi structure for better flow stability. It is preferred that the flow partitioner that is placed in the main flow channel is made by the coaxial pipes of various sizes. The thermal time-of-flight sensing elements are placed at the center of the flow partitioner. The flow partitioner will allow a stable flow across the flow channel and the smallest pipe at the center of flow partitioner will have the highest flow speed while the relative length to the pipe diameter is the longest that provides additional conditions for flow stability and sensitivity. In the preferred embodiment, the size (total diameter) of the partitioner is scalable to the main flow channel size that is determined by the specified full-scale flowrate or the applicable meter classes for either commercial or residential applications. To facilitate the manufacture and often to meet the cost requirements for the city gas metering applications, the center pipe size for all full-scale flowrate can be made the same with the variation only applied to the length of the partitioner. For further enhancement of gas flow stability and measurement repeatability, another flow conditioner is placed at the inlet of the main flow channel. This configuration allows the achievement of a large flow dynamic range as well as excellent flow repeatability for the MEMS sensing elements.

In another preferred embodiment, the disclosed utility gas meter that is capable of metering the custody transfer volumetric flowrate with temperature and pressure compensation while performing in situ measurement of the gas heat value will have the main flow channel with the MEMS sensing elements at control electronics placed into a buffered meter house. This buffered meter house provides additional flow stability at the low flowrates. It also serves as the particle collector as the flow medium flows the inlet is directed towards the bottom of the buffered house and released through the main flow channel at the upper position of the buffered house. This configuration will help the meter to maintain a long product life and better reliability which are needed for city gas residential applications.

In another preferred embodiment, the disclosed utility gas meter that is capable of metering the custody transfer volumetric flowrate with temperature and pressure compensation while performing in situ measurement of the gas heat value will measure the mass flowrate or the temperature and pressure compensated volumetric flowrate and the gas thermal properties simultaneously. The gas composition sensor will normally be at the sleepy mode, and only when a change in gas thermal property is registered, the control electronics will wake up the gas composition sensor to measure the combustion components concentration of the flow gas medium. After the measurements, the conversion of the gas thermal properties to the heat value will be performed and the data will be stored in the memory at the control electronics that can be downloaded via the local data port. These data will also be sent via the remote data communication to the designated data or service center. The corresponding event code will be displayed on the meter's local display.

In another preferred embodiment, the disclosed utility gas meter that is capable of metering the custody transfer volumetric flowrate with temperature and pressure compensation while performing in situ measurement of the gas heat value will have plural numbers of memory units. It is preferred that for data safety and tariff dispute prevention, such numbers of memory units shall not be less than three in case of any storage failure may happen. These data in the independent memories will be able to be retrieved onsite or be transmitted to the designated data or service center at a time interval determined by the user. The stored data can be further retrieved by an external reader via the local data communication port. These data will be compared from time to time by the onboard microcontroller unit (MCU). In case of any discrepancy, an event or alarm will be registered at a different memory that can be retrieved onsite or be transmitted to the designated data or service center if the meter is connected to the network.

In another preferred embodiment, the disclosed utility gas meter that is capable of metering the custody transfer volumetric flowrate with temperature and pressure compensation while performing in situ measurement of the gas heat value will have an ON/OFF valve installed at the inlet of the utility gas meter. This valve is preferred to be a low-power electrical valve that is constantly open. The valve shut-off action will be triggered when gas leakage or some natural disaster such as earthquake takes place. It will be able to be shut off via the remote commands as well as a local pre-programmed trigger threshold. The inlet and outlet configuration of the said meter is made fully compatible with the current standard city gas meter mechanical dimensions.

In yet another preferred embodiment, the disclosed utility gas meter that is capable of metering the custody transfer volumetric flowrate with temperature and pressure compensation while performing in situ measurement of the gas heat value will have the networking capability which is preferable as an exchangeable independent module inside the said meter. Such a configuration will extend the usage of the meter at different geographic locations where the networking system or protocol could be vastly different. The said module can be independently programmed or manufactured according to the order specifications.

For the city utility gas metering, this disclosure provides a solution for metrology that is consistent with the current gas composition independent metrology standards and tariff system while having the advantages of automated temperature and pressure compensation. The simultaneously measured gas heat value with the registered gas composition data will be nontrivial and beneficial for future upgrades for heat value or energy tariff. Even with the current tariff system, the data will contribute to the fair valuation of the supply chain system. In particular, the said meter can be data logged and remotely managed via the network without the requirements of add-on mechanical to electronic data conversion that is not only costly but may fail from time to time in data accuracy and/or safety. The design of the disclosure also allows the seamless replacement of the current mechanical meters in the fields for their full compatibility of the mechanical connectivity.

Other objects, features, and advantages of the present disclosure will become apparent to those skilled in the art through the present disclosures detailed herein wherein like numerals refer to like elements.

BRIEF DESCRIPTIONS OF THE DRAWINGS

FIG. 1. The explosive view of the disclosed utility gas meter assembled with the thermal time-of-flight sensing technology for gas composition independent metrology and gas thermal property measurement with the capability of gas composition measurement for true gas heat value acquisition.

Figure 2:
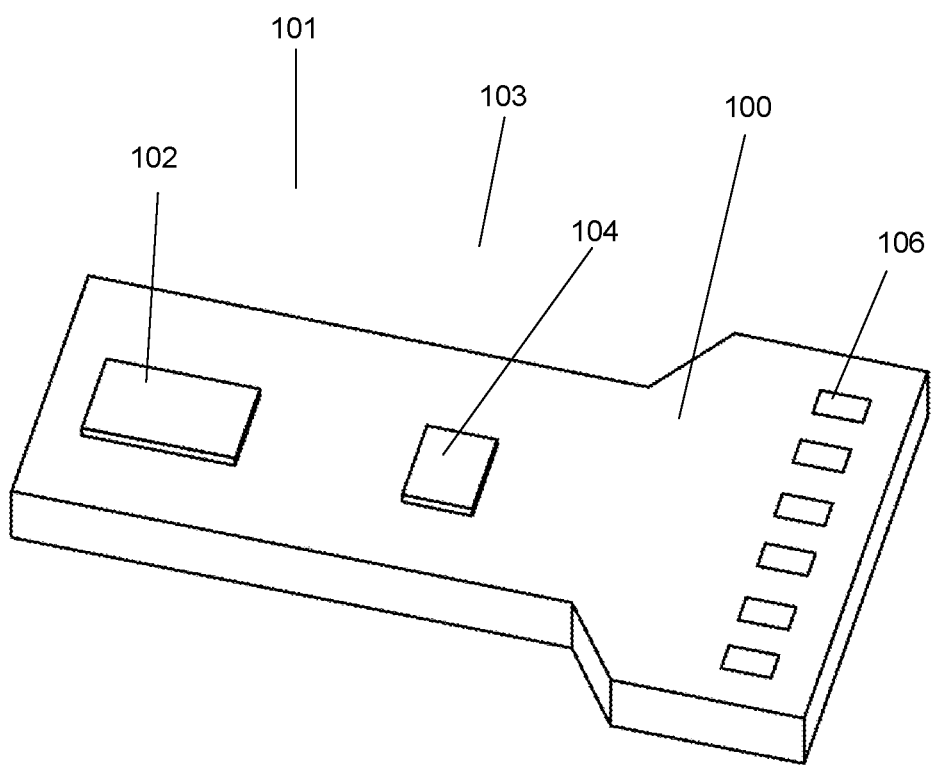

FIG. 2. The design of the MEMS thermal time-of-flight sensor and gas composition sensor carrier probe.

Figure 3:
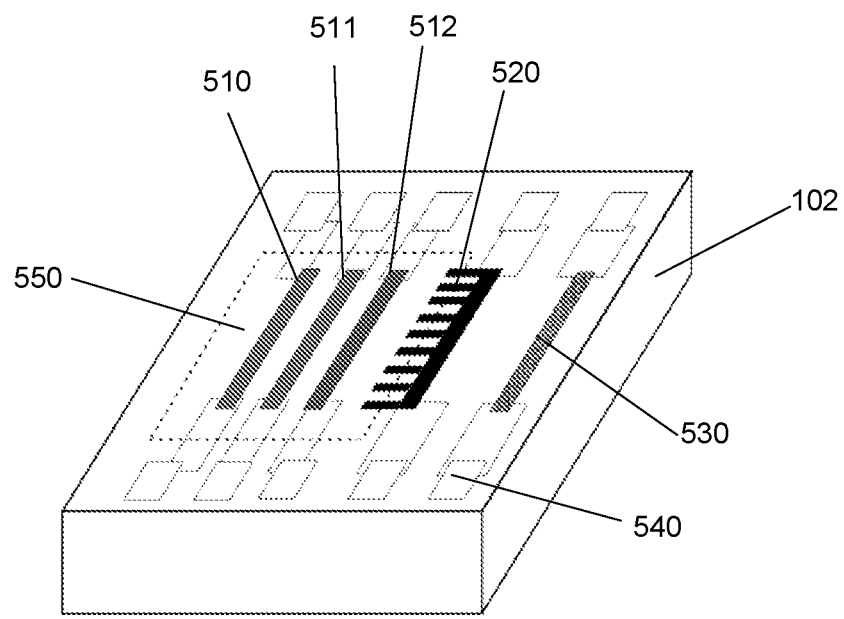

FIG. 3. The design of the MEMS thermal time-of-flight sensor.

Figure 4:
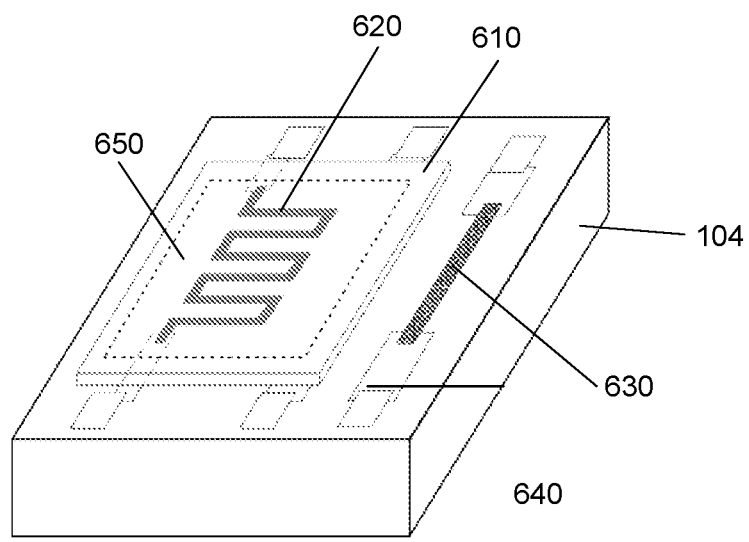

FIG. 4. The design of the MEMS gas composition sensor.

Figure 5:
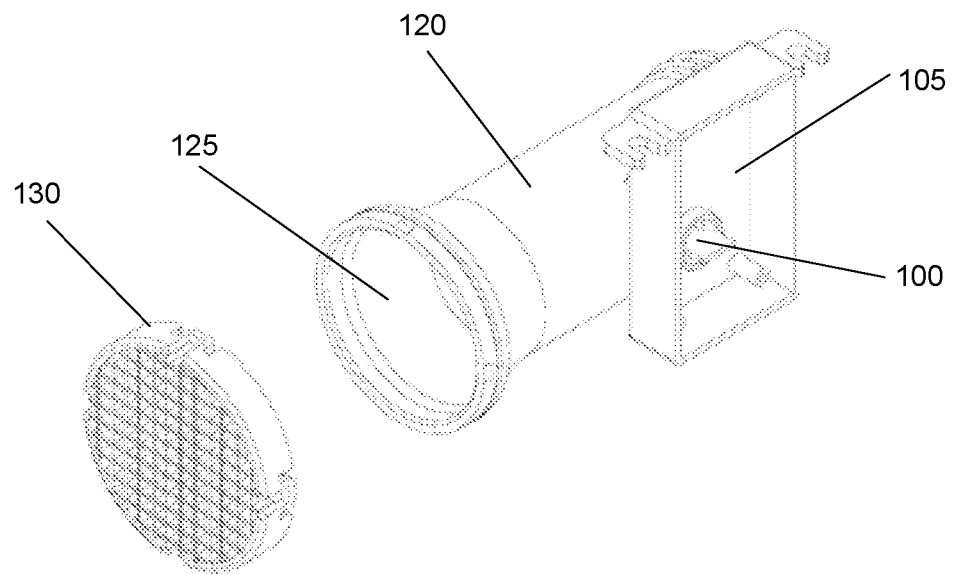

FIG. 5. The detailed view of the disclosed utility gas meter showing the flow channel design and the sensing elements installation and flow conditioner.

Figure 6:
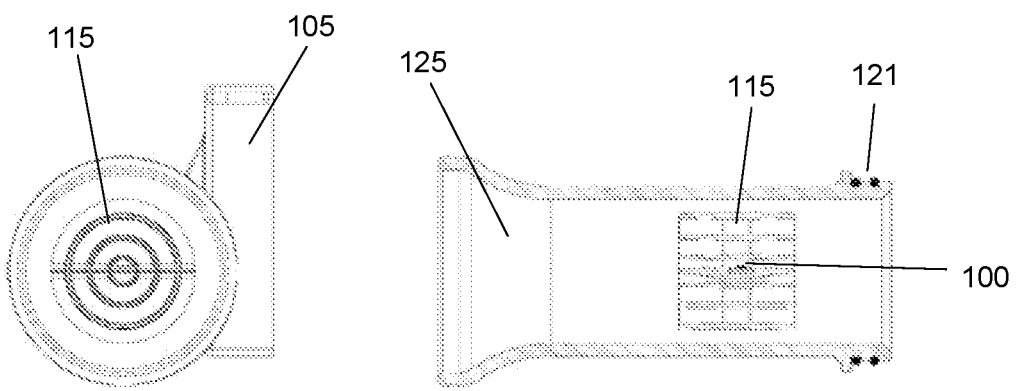

FIG. 6. The detailed view of the disclosed utility gas meter showing the flow channel design and the sensing elements installation and flow partitioner.

Figure 7:
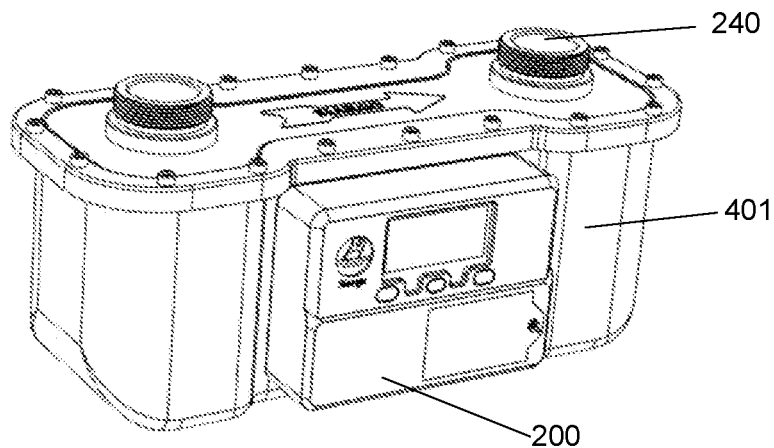

FIG. 7. The final assembled MEMS utility gas meters for commercial applications.

Figure 8:
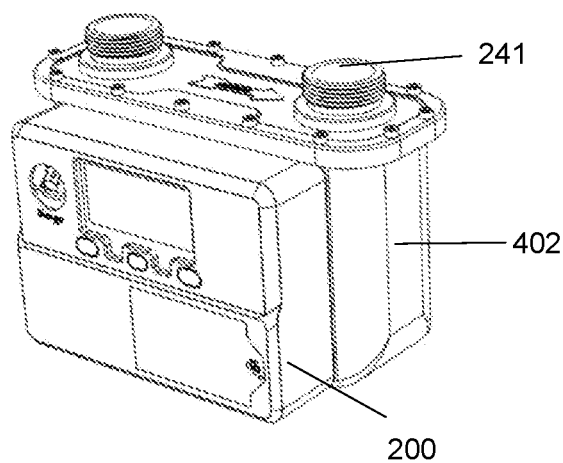

FIG. 8. The final assembled MEMS utility gas meters for residential applications.

DETAILED DESCRIPTION OF THE PREFERRED EMBODIMENTS

The explosive view of the gas meter using MEMS sensing elements for the metrology and gas heat value measurement for city utility gas disclosed in this invention is shown in FIG. 1. The said gas meter is having a MEMS sensor carrier assemble (100) in the form of an insertion probe, on which the MEMS thermal time-of-flight sensor and the gas composition sensor are packaged together. The carrier is preferred to be made with ceramics for better corrosion-proof. The sensor control electronics (110) will have the functions of acquisition of the raw data from the both MEMS thermal time-of-flight sensing elements and the gas composition sensing elements, amplification, and conversion of the analog data via a high precision analog to digital converter (ADC) into digital ones for processing by the microcontroller (MCU) where the digital data are compared to those stored at the calibration to output the correct metering value and thermal parameters of thermal conductivity and specific heat of the flow medium. When the measured gas thermal parameters are found to be different from the first measured and stored values, the gas composition sensor will be wakeup and the composition will be acquired. The MCU will then invoke the algorithm for the gas heat value calculation. Each of such events and the corresponding data will be stored on the same board at plural numbers of solid memories for data safety and will be transmitted to the designated data or service center, simultaneously. Additional tasks by the control electronics will include the detection of battery power status, flowrate abnormality, and others which are interests to the users and be pre-programmed. The sensor probe is installed by inserting into the main flow channel (120), so as the control electronics printed circuitry board that is placed into the control electronics chamber attached to the main flow channel. A flow conditioner (130) is installed at the inlet of the main flow channel for better flow stability. The main flow channel is preferred to be made of molded corrosion-proof engineering plastics such as polycarbonate, and it is fixed and connected to the outlet (240) of the said utility gas meter via a 90 degree smoothly bent tube (140) and sealed with corrosion proof gaskets (150) and (170). The low power electrical valve (160) fixed and installed at the inlet (230) of the said utility gas meter, which can be executed via the remote communication as well as the local control electronics at the time the gas supply must be cut off such as at the occurrence of an earthquake. It can also serve as a pre-payment tariff control either locally or remotely. These assembled components are then placed into a buffer house (200) which is used to redirect the flow path and also can be used for the collection of particles and/or heavy dust that may come with the flow medium. The buffer house is sealed by corrosion-proof gaskets and upper cover (210) and bottom cover (220). Both of these covers are fastened to the buffer house by the screws (250). The buffer house is preferred to be made of sheet metal that is further treated with corrosion-proof plating or painting. And both the inlet and outlet threaded connectors are preferred to be made of metal treated with corrosion-proof finishing. The above assembly is the metrology and control unit (collectively called "metrology unit") of the said utility gas meter. This metrology is then connected to the power, communication, and display unit (collectively called "communication unit") via the sealed cable (350), which is constituent of a display (310), preferred to be made of low power LCD. The front cover (320) is preferred to be made of engineering plastics with corrosion-proof. It has the window covered with glass or transparent plastics with a tamper-proof transparent metal film coating as well as the battery chamber cover (370) which is fixed to the front cover with tamper-proof screws and seal. The front cover also provides the access to the keyboard that is used for password-controlled local meter parameter setting, data access, diagnosis, and third-party calibration or metrology correction. The remote data communication module is preferred to be integrated with the display printed circuitry board (310) in a form of a replaceable module. The remote data communication is preferable to be performed via the industry-standard protocol such as NB-IoT or GPRS or other standards depending on the geographic locations. The power is preferred to be provided by a high capacity lithium-ion battery (360). For some high-power communication protocol, the lithium-ion battery will only serve to power the metrology and control unit of the said utility gas meter. The communication will be powered by external power via the data port which is also integrated to the display printed circuitry board. The communication unit can be a stand-alone unit with the enclosure with the back cover (320) during the manufacture. The combination of the metrology unit and the communication uniforms the said utility gas meter. This configuration is compatible with the existing utility gas meter mechanical connections and allows the easy replacement and installation to the existing gas pipelines.

The schematic carrier probe (100) having the two said MEMS thermal time-of-flight sensor and gas composition sensor is exhibited in FIG. 2. The MEMS thermal time-of-flight sensor (102) is placed at the tip of the carrier probe, while the gas composition sensor (104) is packaged at the stem of the carrier probe. After installation that the probe is inserted into the main flow channel, only the thermal time-of-flight sensor at the tip portion of the carrier will be exposed to the flow channel space (101) and the gas composition sensor will be kept inside a cavity space (103) where the gas can exchange freely with the flow medium via diffusion but no gas flow through. For the best performance of the gas sensor, the cavity opening towards the main flow channel will be installed with a filter that can be effectively filtering out the impurities such as oil vapors or particles or other foreign materials. The connection of the carrier to the control electronics will be via the connection pads (106) that are preferred to be connected by soldering gold plated pins or gold wires. The carrier probe is preferred to be made of ceramic materials with corrosion-proof and its thickness will be in the range of 1 to 2 mm thick such that the thermal boundary conditions can be achieved with a laminar flow profile across the plate having the thermal time-of-flight sensor immersed therein.

The schematic of the said MEMS thermal time-of-flight sensor (102) is exhibited in FIG. 3. The sensor is preferred to be made on a silicon substrate in which a thermal isolation cavity (550) is made via deep reactive ion etching or wet chemical etching. A low-stress silicon nitride and silicon oxide combo films in micrometer thickness are used as the membrane to support three thermistors (510, 511, and 512) that form the thermal time-of-flight sensor and are used for the gas mass flowrate and thermal parameters measurement.

These thermistors are preferred to be made of high-temperature sensitive materials such as platinum, nickel, or doped polycrystalline silicon. In the preferred embodiment, thermistor (510) is used as the microheater that a modulated temperature waveform such as a sine waveform is applied during operation. Thermistors (511 and 512) are placed downstream to the flow direction, and the time difference or phase shift registered on these two thermistors are the measures of the heat transfer by the flow medium. The distance for each of these two thermistors to the microheater is preferred not to be the integer times for another. The gas flow velocity, V, to be measured concerning the temperature-time (T, t) transient in this arrangement will be dependent on the thermal diffusivity (D) and forced convection equation:

$$\frac{\partial T}{\partial t} = D\nabla^2 T - V\nabla T \quad (1)$$

Therefore, at the static condition or V=0, the thermal diffusivity can be measured. As each type of natural gas with a fixed combination of components will have a unique thermal diffusivity and can be converted to the high heat value, the measured data will then be used to register the thermal properties of the flow medium. As the gas supply will not be changed instantly but rather a specific gas supply will last a certain period by days and for city gas applications the usage of the gas will not be non-stop throughout the day, the measurement of the gas thermal properties will then be performed once the zero flow velocity is measured. From equation (1), if one thermistor at downstream, the measurement gas flow velocity will be always associated with the gas thermal properties, and therefore when the gas changes, the measured flow velocity will also change. With the two thermistors at different distances $d_i$ to the microheater, each of the thermistors will sense a different thermal value via the measurement of the transient time and the amplitude. By solving the equations for the measured values from each thermistor, the dynamically unknown and measurement dependent thermal diffusivity can be canceled out and the gas property independent guided flow velocity in the closed conduit to and mass flow can be obtained:

$$V \sim (d_i - \sqrt{4D\ln(t_i^{-0.5}/T)})/t_i \quad (2)$$

The thermistor (530) on the silicon substrate is used to measure the environmental or the gas temperature providing the control of the heating scheme for the microheater, and is preferred to be made of the same materials as the thermistors for thermal time-of-flight sensing elements. The element (520) is preferred to be a thermopile that is used to detect the flow inception for the power-saving operation. As the thermopile detection of the temperature change does not require any external power, and when the control electronics go to a sleep mode, the thermopile will be used to monitor the flow-induced temperature variation and to wakeup the control electronics. All of these thermistors and the thermopile are connected to the carrier board via the pads (540).

To convert the thermal diffusivity of utility gas to its high heat value, it is crucial to exclude any contributions from non-combustion gases in the constituents of the natural gas as in many cases the natural gas may contain gases such as nitrogen and carbon dioxide which does not contribute to the gas heat values. The thermal diffusivity measured by the thermal time-of-flight sensor cannot differentiate whether the values have inclusions of non-combustion gases. Therefore, a gas composition sensor will be required to measure the composition of the flow medium to obtain the correct heat values. FIG. 4 is the schematic of the preferred gas composition sensor for this purpose. The said sensor will have a silicon substrate on which a thermal isolation cavity (650) is made beneath a membrane composed of low stressed silicon nitride and silicon dioxide that can be made with low-pressure chemical vapor deposition. The gas composition sensing elements (610) can be made with metal oxides such as zinc oxide, tin oxide, or tungsten oxide. For enhancement of the sensitivity, a noble metal dopant such as platinum, palladium, or rhodium is added to the metal oxide film during the making. The microheater (620) is used to elevate the metal oxide temperature to its reaction conditions and is preferred to be embedded inside the supporting membrane on top of the thermal isolation cavity, and made of platinum or tungsten. The thermistor (630) placed on the silicon substrate will measure the gas temperature and provide the microheater control feedback. The microheater will be preferred to be operated at two different temperatures to eliminate thermal drifting and other effects. Each of the thermistors and the metal oxide sensing element will be connected to the wire bonding pads (640) that are further connected to the carrier probe.

For the applications of city utility gas metering, one critical requirement is the large dynamic range with custody transfer accuracy. FIG. 5 is the detailed schematic view of the main flow metrology channel (120). The sensor probe (100) inserted into the main flow channel and the house (105) will host the control electronics and will be tightly sealed. The ample space will also allow the gas composition sensor to have the gas exchange at the static conditions. The inlet (125) of the main flow channel will have a diameter larger than that for the main flow channel to create a forced flow with better stability, particularly at the low flowrate. The flow conditioner (130) has been made with the grids that mainly serve as the flow straightener. The size of the main flow channel is determined by the actual meter's full-scale flowrate that varies for different city utility applications. The schematic of the detailed flow partitioner (115) is designed to further stabilize the flow while ensuring the required flow dynamic range is exhibited in FIG. 6. The said flow partitioner is formed by coaxial pipes with different sizes. The diameter difference between the two closest coaxial pipes will not be more than that for the center pipe. The carrier probe with the thermal time-of-flight sensor will be inserted into the center of the partitioner where the flow velocity is the highest, resulting in the best sensitivity. The length of the partitioner along the flow direction is determined by the total length of the main flow channel but it will not be less than ⅓ of the length of the main flow channel.

The disclosed final assembled utility gas meters will have an identical communication unit (200) and only differ in buffer house (400, 401) and inlet/outlet threaded pipe sizes (240, 241) and inlet to outlet distances in compliance with the international utility gas meter standards. The corresponding sizes of the inside mechanical components such as the electrical valve, the main flow channel will also be adjusted accordingly but all electronic components can be kept the same. FIG. 7 is a utility gas meter for commercial applications with an inlet/outlet pipe diameter of 50 mm which equivalent to the mechanical G25 model; and FIG. 8 is a utility gas meter for residential applications with an inlet/outlet pipe diameter of 30 mm.

The invention claimed is:
1. An electronic utility gas meter that is capable of metering the custody transfer and gas temperature and pressure independent volumetric flowrate while performing in situ measurement of the gas thermal properties and gas composition with conversion to gas heat value comprising A MEMS thermal time-of-flight sensor for metering the custody transfer city utility gas, operating with modulated microheater for simultaneous measurements of gas composition independent volumetric flowrate and gas thermal properties, while the volumetric flowrate is compensated during gas temperature and pressure variations;

A MEMS gas composition sensor for in situ measurement of the combustion gas compositions providing the conversion of the gas thermal properties to the desired gas high heat value that can be used for upgrading the tariff based on gas high heat values;

An independent main flow channel that is constituent of a flow channel, a flow partitioner, a flow straightener and chambers to host the control electronics and sensor carrier probe, respectively;

A control electronics printed circuitry board for acquisition of the data from the flowrate, thermal property, and gas composition sensing elements, processing the data conversion, performing the data communication; managing the power supply, providing the onboard data storage, display the metering information, and managing the failure events;

An electrical valve that can be executed via local control electronics as well as remote programming to provide supply shut-off in case of hazardous conditions, and provide tariff enforcement;

A buffer house to host the components for custody transfer metrology performance and heat value measurement, electrical valve, enhancement of reliability, as well as mechanical connections to the supply pipelines;

A communication unit with wired and wireless options that enable the data transmission and allow the manual access to the onboard data storage, programming the user-specified functions, and diagnosis the meter performance, display the metering data locally and provide the tamper-proof and other protections; and A lithium-ion battery power pack that provides the power to the operation of the utility gas meter.

2. An electronic utility gas meter that is capable of metering the custody transfer and gas temperature and pressure independent volumetric flowrate while performing in situ measurement of the gas thermal properties and gas composition with conversion to gas heat value of claim 1 wherein said MEMS thermal time-of-flight sensor will have the capability of metering the gas flowrate that is independent of environmental temperature and pressure variation in favor for the accurate city utility gas metering for tariff; and will have the capability for gas thermal property measures as well as detection of the flow inception from a static status.

3. The MEMS thermal time-of-flight sensor of claim 2 wherein the thermal time-of-flight sensing will be made on a silicon substrate with a plural number of thermistors in parallel but at different distances to each other, and will most be preferred to be made of three thermistors; it will be placed on a thermally isolated membrane with an underneath cavity, the distances will be preferred to be from 5 $\mu$m to 500 $\mu$m, but most preferred to be from 30 $\mu$m to 150 $\mu$m; the thermistors will be made of high-temperature sensitive materials such as platinum, nickel, or doped polycrystalline silicon; the first thermistor at the upstream of flow will be used as the microheater applied with modulated heater waves; the modulation can be pulsed heat, sine, cosine, or other types of a waveform, but most preferred to be sine waveform; a separated thermistor made of the same materials but placed on the silicon substrate will provide the measurement of gas temperature for control of the microheater.

4. The MEMS thermal time-of-flight sensor of claim 2 wherein the flow inception detection is made of a thermopile that is placed on the same membrane with the underneath thermally isolation cavity; such a thermopile will not require external power for operation and will ensure the low-power operation of the said thermal time-of-flight sensor.

5. An electronic utility gas meter that is capable of metering the custody transfer and gas temperature and pressure independent volumetric flowrate while performing in situ measurement of the gas thermal properties and gas composition with conversion to gas heat value of claim 1 wherein said gas composition sensor will use the measured combustion gas composition to exclude the contribution of the non-combustion gas components of a natural gas, which corrects the measured thermal properties before conversion to the high heat value of the measured gas.

6. The MEMS gas composition sensor of claim 2 will be made of MEMS sensing technology which utilizes the doped metal oxide to measure the combustion gas compositions; the preferred metal oxide can be zinc oxide, tin oxide, or tungsten oxide with doped platinum, palladium, or rhodium but most preferred to be zinc oxide with doped rhodium; the metal oxide will be placed on a membrane above a thermally isolated cavity.

7. An electronic utility gas meter that is capable of metering the custody transfer and gas temperature and pressure independent volumetric flowrate while performing in situ measurement of the gas thermal properties and gas composition with conversion to gas heat value of claim 1 wherein said independent main flow channel will have a straight pipe, a flow straightener, a flow partitioner, and a chamber that hosts the control electronics and the sensor carrier probe; the main flow channel will be made of molded corrosion-proof engineering plastics and fixed to the outlet of the meter via a bent pipe with the same diameter; the flow straightener will be formed with plastic grids and installed at the flow channel's inlet that is made 1.2 to 1.5 times larger in diameter than that of the flow channel.

8. The sensor carrier probe of claim 7 is insertion-installed into the flow channel where a flow partitioner is placed with the thermal time-of-flight sensor aligned at the center of the flow channel; the flow partitioner is formed by coaxial pipes with different sizes; the diameter difference between the two closest coaxial pipes will not be more than that for the center pipe; the carrier probe with the thermal time-of-flight sensor will be aligned and inserted into the center of the partitioner where the sensitivity is the highest; the length of the partitioner along the flow direction is determined by the total length of the main flow channel but it will not be less than $\frac{1}{3}$ of the length of the main flow channel.

9. The MEMS gas composition sensor on the sensor carrier probe of claim 7 will be placed on the sensor carrier probe where it will not be immersed into the main flow channel but in the static space close to the electronics hosting chamber on the main flow channel; the static space will have a window that can freely exchange the gas contents with the flow medium; the window will have a filter installed to prevent contaminants such as oil vapor and particles.

10. An electronic utility gas meter that is capable of metering the custody transfer and gas temperature and pressure independent volumetric flowrate while performing in situ measurement of the gas thermal properties and gas composition with conversion to gas heat value of claim 1 wherein said control electronics will provide the data process of the acquired temperature and pressure independent mass flowrate, gas thermal properties and the combustion gas compositions of the flow medium from the said MEMS sensing elements; the control electronics will perform the conversion from the in situ measured data to the gas high heat values and further keep all of these data into a plural number of solid memories, and preferably into three separate solid memories such that any electronic malfunctioning will not impact the data safety; in the case that the meter is connected to a network, the control electronics will respond to the remote inquires or automatically transmit any data registry to the designated data center or service center while displaying the same on the meter LCD; the control electronics will also perform power status monitor and evaluation, and send alarm registers at a fixed time that can be programmed in advance before the end of the battery life.

11. An electronic utility gas meter that is capable of metering the custody transfer and gas temperature and pressure independent volumetric flowrate while performing in situ measurement of the gas thermal properties and gas composition with conversion to gas heat value of claim 1 wherein said electrical ON/OFF valve will be installed at the inlet of the said utility gas meter and be constantly open; the execution of the valve will be driven by the control electronics of the meter and also it can be operated from the remote data or service center via communication on cases that gas supply is required to be cut off due to emergency such as an earthquake; the valve can also be used for the pre-pay tariff purpose that the valve will be placed at the close status until the payment is cleared.

12. An electronic utility gas meter that is capable of metering the custody transfer and gas temperature and pressure independent volumetric flowrate while performing in situ measurement of the gas thermal properties and gas composition with conversion to gas heat value of claim 1 wherein said buffer house will be used to host the metrology components and the electrical valve of the said meter; the buffer house will also serve as a tool for reliability enhancement when the space allows the particles or other impurities that may contain in the city gas to be settled at the bottom of the buffer house.

13. An electronic utility gas meter that is capable of metering the custody transfer and gas temperature and pressure independent volumetric flowrate while performing in situ measurement of the gas thermal properties and gas composition with conversion to gas heat value of claim 1 wherein said mechanical connectors are preferable to be identical to those standard mechanical meters that are currently in the field such that the replacement can be done seamlessly without changing the original mechanical piping.

14. An electronic utility gas meter that is capable of metering the custody transfer and gas temperature and pressure independent volumetric flowrate while performing in situ measurement of the gas thermal properties and gas composition with conversion to gas heat value of claim 1 wherein said control electronics unit shall provide the interface for wired or wireless transmission apparatus such as NB-IoT, Bluetooth, Zigbee, infrared transmission and/or general packet radio service (GPRS) transmission apparatus, per the local regulations where the meter is installed.

15. An electronic utility gas meter that is capable of metering the custody transfer and gas temperature and pressure independent volumetric flowrate while performing in situ measurement of the gas thermal properties and gas composition with conversion to gas heat value of claim 1 wherein said low power operation by the high capacity lithium-ion battery will have the capability of averaged power in microwatt such that the battery power can provide reasonable field operation time, preferably fifteen years, but not less than the years.

* * * * *